United States Patent
Park et al.

(10) Patent No.: US 9,202,630 B2
(45) Date of Patent: *Dec. 1, 2015

(54) MULTILAYER CERAMIC CAPACITOR AND MOUNTING BOARD THEREFOR

(71) Applicant: SAMSUNG ELECTRO-MECHANICS CO., LTD., Suwon, Gyunggi-do (KR)

(72) Inventors: Min Cheol Park, Gyunggi-do (KR); Heung Kil Park, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 184 days.

This patent is subject to a terminal disclaimer.

(21) Appl. No.: 13/950,024

(22) Filed: Jul. 24, 2013

(65) Prior Publication Data

US 2014/0311786 A1    Oct. 23, 2014

(30) Foreign Application Priority Data

Apr. 22, 2013 (KR) .................. 10-2013-0044153

(51) Int. Cl.
*H01G 4/228* (2006.01)
*H01G 4/38* (2006.01)
*H05K 1/02* (2006.01)
*H05K 3/34* (2006.01)

(52) U.S. Cl.
CPC ............. *H01G 4/385* (2013.01); *H05K 1/0231* (2013.01); *H05K 3/3442* (2013.01); *H05K 2201/10015* (2013.01); *H05K 2201/10636* (2013.01)

(58) Field of Classification Search
USPC ............... 361/306.3, 301.2, 301.4, 303–305, 361/306.1, 321.1, 321.2
See application file for complete search history.

(56) References Cited

U.S. PATENT DOCUMENTS

2012/0162853 A1    6/2012   Togashi
2014/0311785 A1*  10/2014   Park et al. .................... 174/260

FOREIGN PATENT DOCUMENTS

JP    2010-177572 A    8/2010
JP    2012-138415 A    7/2012

* cited by examiner

*Primary Examiner* — Nguyen T Ha
(74) *Attorney, Agent, or Firm* — McDermott Will & Emery LLP

(57) ABSTRACT

There is provided a multilayer ceramic capacitor including a ceramic body, first and second capacitor parts, first and second internal connection conductors, and first to fourth external electrodes, wherein the first capacitor part is connected to the first connection conductor in series, and the second capacitor part is connected to the second connection conductor in series, the second connection conductor being connected to the first connection conductor in series.

18 Claims, 5 Drawing Sheets

A-A'

(A1)     (A2)

MULTILAYER CERAMIC CAPACITOR AND MOUNTING BOARD THEREFOR

CROSS-REFERENCE TO RELATED APPLICATIONS

This application claims the priority of Korean Patent Application No. 10-2013-0044153 filed on Apr. 22, 2013, in the Korean Intellectual Property Office, the disclosure of which is incorporated herein by reference.

BACKGROUND OF THE INVENTION

1. Field of the Invention

The present invention relates to a multilayer ceramic capacitor and a mounting board therefor.

2. Description of the Related Art

A multilayer ceramic capacitor, a multilayer chip electronic component, is a chip-shaped condenser mounted on the printed circuit boards of various electronic products such as display devices, liquid crystal displays (LCDs), plasma display panels (PDPs) and the like, for example, as well as computers, smartphones, mobile phones, and the like, to serve to charge and discharge electricity therein.

Since such a multilayer ceramic capacitor (MLCC) has advantages such as a small size, high capacitance, ease of mounting, or the like, such a multilayer ceramic capacitor may be used as a component in various electronic devices.

The multilayer ceramic capacitor may have a structure in which a plurality of dielectric layers and internal electrodes having different polarities are alternately stacked while being interposed between the dielectric layers.

In particular, in a power supply device for a central processing unit (CPU) such as a computer, or the like, voltage noise may be generated due to rapid changes in a level of a load current during a process of providing low level voltage.

Therefore, a multilayer capacitor has been widely used as a decoupling capacitor for suppressing voltage noise in such a power supply device.

Demands have been made for a decoupling multilayer ceramic capacitor to have low equivalent series inductance (ESL) in accordance with an increase in an operational frequency, and research into technologies for decreasing ESL have been, actively undertaken.

In addition, in order to supply power more stably, demands have been made for the decoupling multilayer ceramic capacitor to have controllable equivalent series resistance (ESR) characteristics.

In the case in which the multilayer ceramic capacitor has a ESR level lower than a desired ESR level, ESL of the multilayer ceramic capacitor and an impedance peak in a parallel resonance frequency generated due to plane capacitance of a microprocessor package may be increased, while impedance in a series resonance frequency of the multilayer ceramic capacitor may be extremely decreased.

Therefore, ESR characteristics of the decoupling multilayer ceramic capacitor may be easily controlled and improved, such that flat impedance characteristics in a power distribution network may be implemented by a user.

In connection with the controlling of ESR, using a material having high electrical resistance for an external electrode and an internal electrode may be considered. Using a material having high electrical resistance may be advantageous, in that high ESR characteristics are provided while a low ESL structure is maintained, as in the case of the related art.

However, in the case of using a material having a high degree of electrical resistance for an external electrode, a localized heat spot caused by a current channeling phenomenon due to a pin hole is generated. In addition, in the case of using a material having a high degree of electrical resistance for an internal electrode, an internal electrode material needs to be continuously changed so as to match a ceramic material according to high capacitance.

Therefore, since the method of controlling ESR according to the related art has disadvantages as described above, research into a multilayer ceramic capacitor allowing for control of ESR remains necessary.

In addition, with a rapid development of a mobile terminal such as a tablet PC, an ultrabook, or the like, in recent years, a micro processor has been converted to a high-integration product having a small size.

Therefore, since an area of a printed circuit board is decreased and a space for mounting a decoupling capacitor therein is limited, a multilayer ceramic capacitor capable of overcoming the disadvantages has been demanded.

RELATED ART DOCUMENT (Patent Document 1) Japanese Patent Laid-Open Publication No. JP 2012-138415

SUMMARY OF THE INVENTION

An aspect of the present invention provides a multilayer ceramic capacitor and a mounting board therefor.

According to an aspect of the present invention, there is provided a multilayer ceramic capacitor including: a ceramic body including a plurality of dielectric layers and having first and second main surfaces facing each other, first and second side surfaces facing each other, and first and second end surfaces facing each other; a first capacitor part formed in the ceramic body and including a first internal electrode exposed to the first end surface and a second internal electrode having a lead portion exposed to the first side surface, and a second capacitor part including a third internal electrode exposed to the first end surface and a fourth internal electrode having a lead portion exposed to the second side surface; first and second internal connection conductors disposed with respective dielectric layers interposed therebetween and having at least one polarity; and first to fourth external electrodes formed on outer surfaces of the ceramic body and electrically connected to the first to fourth internal electrodes and the first and second internal connection conductors, wherein the first capacitor part is connected to the first connection conductor in series, and the second capacitor part is connected to the second connection conductor in series, the second connection conductor being connected to the first connection conductor in series.

The first and second external electrodes may be disposed on the first and second end surfaces facing each other of the ceramic body, and the third and fourth external electrodes may be disposed on the first and second side surfaces facing each other of the ceramic body.

The first internal connection conductor may be exposed to the first side surface and the second end surface and may be connected to the second internal electrode through the third external electrode.

The second internal connection conductor may be exposed to the first side surface and the second side surface and may be connected to the fourth internal electrode through the fourth external electrode.

The second internal connection conductor may be exposed to the first side surface and the second side surface and may be connected to the second internal electrode through the third external electrode.

The second internal connection conductor may be connected to the first internal connection conductor through the third external electrode.

The first capacitor part and the second capacitor part may be connected in parallel.

Equivalent series resistance (ESR) of the multilayer ceramic capacitor may be controlled by the first internal connection conductor.

According to another aspect of the present invention, there is provided a mounting board for a multilayer ceramic capacitor, the mounting board including: a printed circuit board having first and second electrode pads disposed thereon; and a multilayer ceramic capacitor mounted on the printed circuit board, wherein the multilayer ceramic capacitor includes: a ceramic body including a plurality of dielectric layers and having first and second main surfaces facing each other, first and second side surfaces facing each other, and first and second end surfaces facing each other; a first capacitor part formed in the ceramic body and including a first internal electrode exposed to the first end surface and a second internal electrode having a lead portion exposed to the first side surface, and a second capacitor part including a third internal electrode exposed to the first end surface and a fourth internal electrode having a lead portion exposed to the second side surface; first and second internal connection conductors disposed with respective dielectric layers interposed therebetween and having at least one polarity; and first to fourth external electrodes formed on outer surfaces of the ceramic body and electrically connected to the first to fourth internal electrodes and the first and second internal connection conductors, and the first capacitor part is connected to the first connection conductor in series, and the second capacitor part is connected to the second connection conductor in series, the second connection conductor being connected to the first connection conductor in series.

The first and second external electrodes may be disposed on the first and second end surfaces facing each other of the ceramic body, and the third and fourth external electrodes may be disposed on the first and second side surfaces facing each other of the ceramic body.

The first internal connection conductor may be exposed to the first side surface and the second end surface and may be connected to the second internal electrode through the third external electrode.

The second internal connection conductor may be exposed to the first side surface and the second side surface and may be connected to the fourth internal electrode through the fourth external electrode.

The second internal connection conductor may be exposed to the first side surface and the second side surface and may be connected to the second internal electrode through the third external electrode.

The second internal connection conductor may be connected to the first internal connection conductor through the third external electrode.

The first capacitor part and the second capacitor part may be connected in parallel.

Equivalent series resistance (ESR) of the multilayer ceramic capacitor may be controlled by the first internal connection conductor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
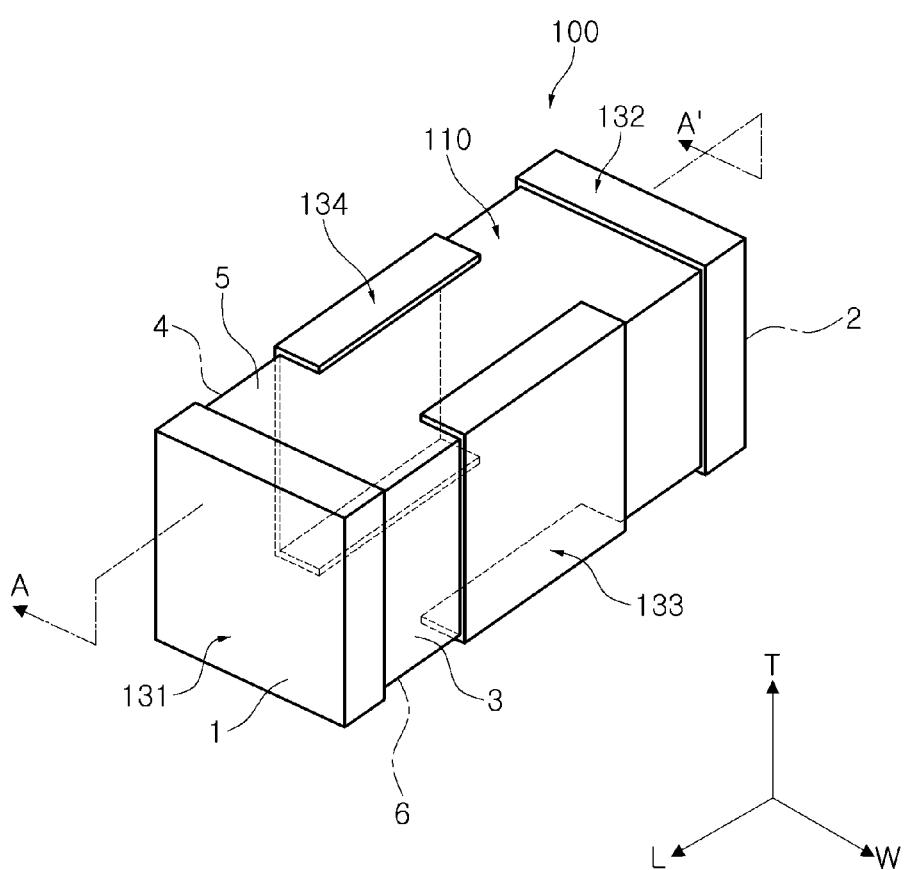
FIG. 1 is a perspective view of a multilayer ceramic capacitor according to an embodiment of the present invention.

Embodiments of the present invention will now be described in detail with reference to the accompanying drawings.

The embodiments of the present invention may be modified in many different forms and the scope of the invention should not be limited to the embodiments set forth herein.

Rather, these embodiments are provided so that this disclosure will be thorough and complete, and will fully convey the concept of the invention to those skilled in the art.

In the drawings, the shapes and dimensions of the elements may be exaggerated for clarity.

In addition, components having like functions are denoted by like reference numerals throughout the drawings of each embodiment.

When defining each direction of a hexahedron in order to clearly describe the embodiment of the present invention, L, W and T shown in a drawing refer to a length direction, a width direction, and a thickness direction, respectively. Here, a thickness direction may be used as the same meaning as a direction in which the dielectric layers are stacked.

Multilayer Ceramic Capacitor

Hereinafter, exemplary embodiments of the present invention will now be described in detail with reference to the accompanying drawings.

FIG. 1 is a perspective view of a multilayer ceramic capacitor according to an embodiment of the present invention.

Figure 2:
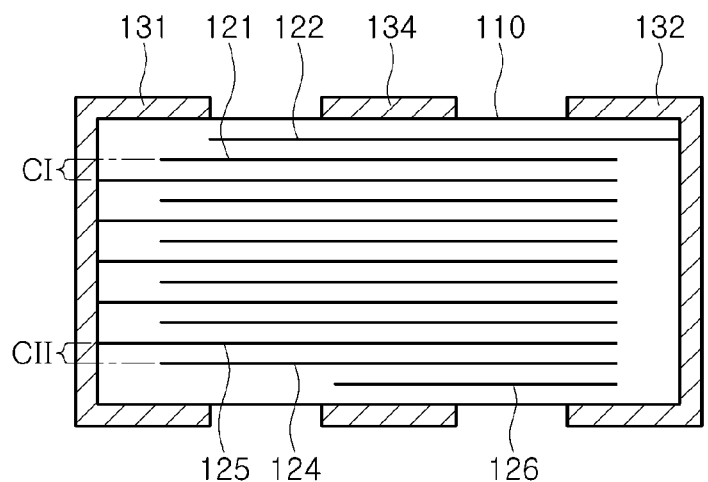
FIG. 2 is a cross-sectional view taken along line A-A' of FIG. 1.

FIG. 2 is a cross-sectional view taken along line A-A' of FIG. 1.

Figure 3:
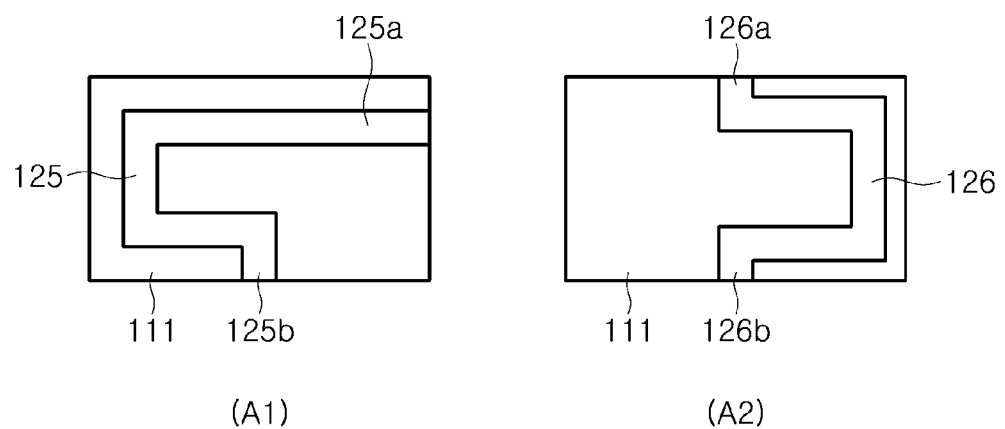
FIG. 3 is a plan view showing first and second internal connection conductors employable in the multilayer ceramic capacitor shown in FIG. 1.

FIG. 3 is a plan view showing first and second internal connection conductors employable in the multilayer ceramic capacitor shown in FIG. 1.

Figure 4:
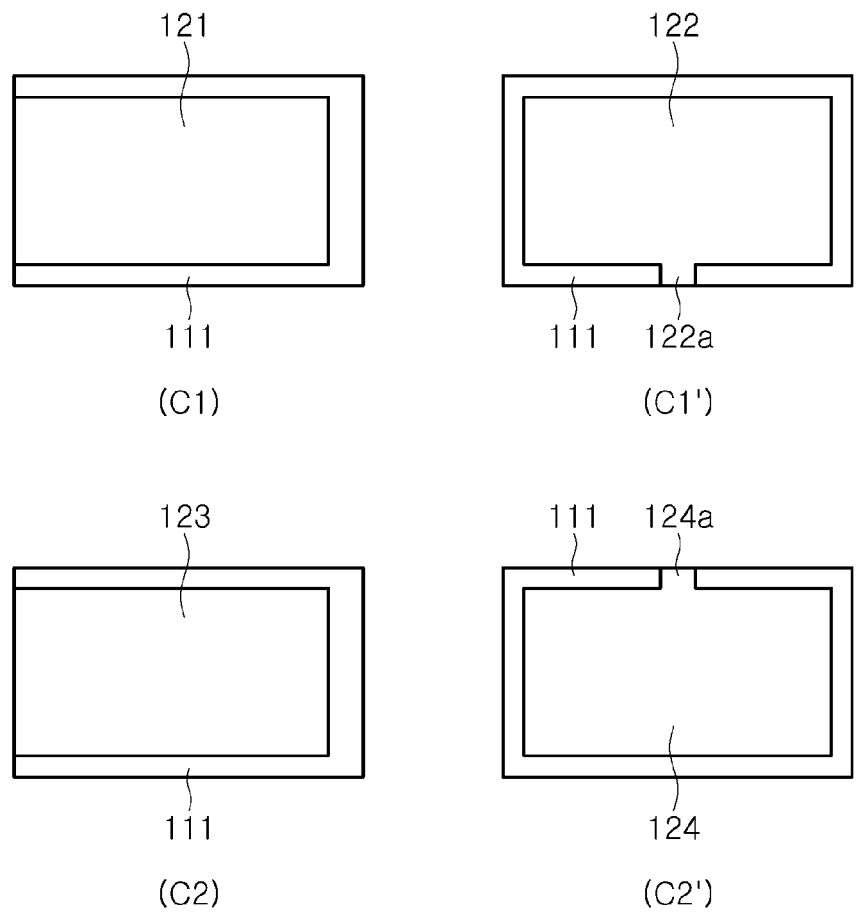
FIG. 4 is a plan view showing first to fourth internal electrodes able to be used with the first and second internal connection conductors shown in FIG. 3.

FIG. 4 is a plan view showing first to fourth internal electrodes able to be used with the first and second internal connection conductors shown in FIG. 3.

Referring to FIGS. 1 to 4, a multilayer ceramic capacitor 100 according to the embodiment of the present invention may include a ceramic body 110 including a plurality of dielectric layers 111, and having first and second main surfaces facing each other, first and second side surfaces facing each other, and first and second end surfaces facing each other.

According to the embodiment of the present invention, the ceramic body 110 may have a first main surface 5 and a second main surface 6 facing each other, a first side surface 3 and a second side surface 4 connecting the first main surface and the second main surface to each other, and a first end surface 1 and a second end surface 2.

The ceramic body 110 is not specifically limited in view of a shape, but may have a hexahedral shape as shown in drawings.

The ceramic body 110 may be formed by stacking a plurality of dielectric layers, and a plurality of internal electrodes 121, 122, 123, and 124 (first to fourth internal electrodes in sequence) may be disposed to be spaced from each other in the ceramic body 110, with respective dielectric layers interposed therebetween.

The plurality of dielectric layers 111 configuring the ceramic body 110 may be in a sintered state and boundaries between adjacent dielectric layers 111 may be integrated such that they may not be readily discernible.

The dielectric layer 111 may be formed by sintering a ceramic green sheet containing a ceramic powder, an organic solvent, and an organic binder. As the ceramic powder, a high k material, a barium titanate ($BaTiO_3$) based material, a strontium titanate ($SrTiO_3$) based material, or the like, may be used. However, the ceramic powder is not limited thereto.

The multilayer ceramic capacitor 100 may include a first capacitor part CI including the first internal electrode 121 exposed to the first end surface 1 of the ceramic body 110 and the second internal electrode 122 having a lead portion 122a exposed to the first side surface 3 of the ceramic body 110, and a second capacitor part CII including the third internal electrode 123 exposed to the first end surface 1 and the fourth internal electrode 124 having a lead portion 124a exposed to the second side surface 4.

According to the embodiment of the present invention, the first to fourth internal electrodes 121, 122, 123, and 124 may be formed of a conductive paste containing a conductive metal.

The conductive metal may be nickel (Ni), copper (Cu), palladium (Pd), or an alloy thereof, but is not limited thereto.

An internal electrode layer may be printed on the ceramic green sheet configuring the dielectric layer by using the conductive paste through a printing method such as a screen printing method or a gravure printing method.

Several layers of the ceramic green sheet having the internal electrode layer printed thereon may be alternately stacked and sintered to thereby form the ceramic body.

In addition, the multilayer ceramic capacitor 100 may include first and second internal connection conductors 125 and 126 disposed with respective dielectric layers 111 interposed therebetween in the ceramic body 110 and having at least one polarity.

The first and second internal connection conductors 125 and 126 are not specifically limited, and for example, may be formed of a conductive paste containing a conductive metal, similarly to the first to fourth internal electrodes 121, 122, 123, and 124.

The conductive metal may be nickel (Ni), copper (Cu), palladium (Pd), or an alloy thereof, but is not limited thereto.

In addition, the multilayer ceramic capacitor 100 may include first to fourth external electrodes 131, 132, 133, and 134 formed on outer surfaces of the ceramic body 110 and electrically connected to the first to fourth internal electrodes 121, 122, 123, and 124 and the first and second internal connection conductors 125 and 126.

The first and second external electrodes 131 and 132 may be disposed on the first and second end surfaces 1 and 2 facing each other of the ceramic body 110, and the third and fourth external electrodes 133 and 134 may be disposed on the first and second side surfaces 3 and 4 facing each other of the ceramic body 110.

According to the embodiment of the present invention, it may be appreciated that two external electrodes 133 and 134 except for the first and second external electrodes 131 and 132 used as external terminals for connection with a power line may be used to control equivalent serial resistance (ESR).

However, the first and second external electrodes used as the external terminals may be arbitrarily selected according to desired ESR characteristics and thus, are not particularly limited.

The first to fourth external electrodes 131, 132, 133, and 134 may be formed of a conductive paste containing a conductive metal.

The conductive metal may be nickel (Ni), copper (Cu), tin (Sn), or an alloy thereof, but is not limited thereto.

The conductive paste may further include an insulating material, and the insulating material is not particularly limited, but for example, may be a glass.

A method of forming the first to fourth external electrodes 131, 132, 133, and 134 is not particularly limited. That is, the first to fourth external electrodes may be formed by dipping the ceramic body or by using other methods such as a plating method, and the like.

The multilayer ceramic capacitor 100 may be a four-terminal capacitor having four external electrodes, but the present invention is not limited thereto.

Hereinafter, configurations of the internal electrodes 121, 122, 123, and 124, the first and second internal connection conductors 125 and 126, and the external electrodes 131, 132, 133, and 134 in the multilayer ceramic capacitor 100 according to the embodiment of the present invention will be described in detail with reference to FIGS. 2 to 4.

The first capacitor part CI may include the first internal electrode 121 exposed to the first end surface 1 of the ceramic body 110 and the second internal electrode 122 having the lead portion 122a exposed to the first side surface 3 of the ceramic body 110 to form capacitance.

In addition, the second capacitor part CII may include the third internal electrode 123 exposed to the first end surface 1 of the ceramic body 110 and the fourth internal electrode 124 having the lead portion 124a exposed to the second side surface 4 of the ceramic body 110 to form capacitance.

The first capacitor part CI and the second capacitor part CII may be disposed in the ceramic body 110 without specific limitation, and a plurality of first capacitor parts and a plurality of second capacitor parts may be stacked in order to implement a target capacitance.

According to the embodiment of the present invention, the first capacitor part CI and the second capacitor part CII may be connected in parallel in the multilayer ceramic capacitor 100.

The first to fourth internal electrodes 121, 122, 123, and 124 and the first and second internal connection conductors 125 and 126 may be alternately disposed with the respective dielectric layers 111 interposed therebetween. The first and third internal electrodes 121 and 123 may have the same polarity, and the second and fourth internal electrodes 122 and 124 and the first and second internal connection conductors 125 and 126 may have the same polarity opposed to that of first and third internal electrodes 121 and 123.

Each of the first and second internal connection conductors 125 and 126 may be shown in FIG. 3, but a plurality of internal connection conductors having at least one polarity may be provided.

Similar to the internal connection conductor, each of the first to fourth internal electrodes 121, 122, 123, and 124 may be shown in FIG. 4, but a plurality of internal electrodes may be actually used in a specific example (C1, C1', C2, or C2').

Meanwhile, the internal connection conductors and the internal electrodes may be stacked in a sequence of A1-A2-C1-C1'-C2-C2' shown in FIGS. 3 and 4, but may be stacked in various types of sequence as needed.

For example, as shown in FIG. 2, the first and second internal connection conductors 125 and 126 may be disposed so as to be positioned between the first capacitor part CI and the second capacitor part CII, or the first and second internal connection conductors 125 and 126 may be spaced apart from each other.

In particular, desired ESR characteristics may be precisely controlled by changing a width, a length, and the number of layers of the first and second internal connection conductors 125 and 126.

According to the embodiment of the present invention, the internal connection conductor 125 may be exposed to the first side surface 3 and the second end surface 2, and may be connected to the second internal electrode 122 through the third external electrode 133, but the present invention is not limited thereto.

The first internal connection conductor 125 may be exposed to the first side surface 3 and the second end surface 2 through respective lead portions 125a and 125b.

According to the embodiment of the present invention, the second internal connection conductor 126 may be exposed to the first side surface 3 and the second side surface 4, and may be connected to the fourth internal electrode 124 through the fourth external electrode 134.

According to the embodiment of the present invention, the second internal connection conductor 126 may be exposed to the first side surface 3 and the second side surface 4, and may be connected to the second internal electrode 122 through the third external electrode 133.

The second internal connection conductor 126 may be exposed to the first side surface 3 and the second side surface 4 through respective lead portions 126a and 126b.

In addition, the second internal connection conductor 126 may be connected to the first internal connection conductor 125 through the third external electrode 133.

Pattern shapes of the first and second internal connection conductors 125 and 126 shown in FIG. 3 are merely provided by way of example according to the embodiment of the present invention. Therefore, the internal connection conductors may have various pattern shapes in order to control the ESR.

For example, the first and second internal connection conductors 125 and 126 shown in FIG. 3 may have the same pattern shapes as those of the first to fourth internal electrodes 121, 122, 123, and 124 shown in FIG. 4.

According to the embodiment of the present invention, the ESR of the multilayer ceramic capacitor may be controlled by the first and second internal connection conductors 125 and 126, and in particular, the ESR of the multilayer ceramic capacitor may be entirely controlled by the first internal connection conductor.

That is, as described below, the first capacitor part CI including the first internal electrode 121 and the second internal electrode 122 and the second capacitor part CII including the third internal electrode 123 and the fourth internal electrode 124 may be connected in parallel, and in particular, the second capacitor part CII may be connected to the second internal connection conductor 126 in series.

In addition, the first internal connection conductor 125 may be connected to the first capacitor part CI and the second capacitor part CII in series.

Due to the connections as described above, the ESR of the multilayer ceramic capacitor may be controlled by the first and second internal connection conductors 125 and 126, and in particular, the ESR of the multilayer ceramic capacitor may be entirely controlled by the first internal connection conductor.

In addition, according to the embodiment of the present invention, the first and second external electrodes 131 and 132 may be used as external terminals for connection with the power line, and for example, the first external electrode 131 may be connected to a power source, and the second external electrode 132 may be connected to a ground.

Meanwhile, the third and fourth external electrodes 133 and 134, two external electrodes except for the first and second external electrodes 131 and 132, may be used to control ESR, and may be non-contact terminals.

Figure 5:
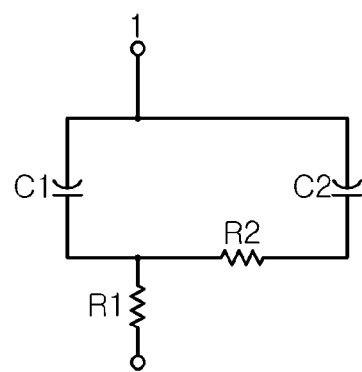
FIG. 5 is an equivalent circuit diagram of the multilayer ceramic capacitor shown in FIG. 1.

FIG. 5 is an equivalent circuit diagram of the multilayer ceramic capacitor shown in FIG. 1.

Referring to FIG. 5, the first capacitor part CI including the first internal electrode 121 and the second internal electrode 122 and the second capacitor part CII including the third internal electrode 123 and the fourth internal electrode 124 may be connected in parallel, and in particular, the second capacitor part CII may be connected to the second internal connection conductor 126 in series.

As described above, the multilayer ceramic capacitor according to the embodiment of the present invention may have two types of ESR and capacitor parts, of which values are controlled, respectively.

The multilayer ceramic capacitor according to the embodiment of the present invention may have a structure including the internal electrodes 121, 122, 123, and 124, the internal connection conductors 125 and 126, and the external electrodes as described above, whereby a reduction in impedance and a control thereof may be facilitated within a relatively large frequency band, as compared to the case of a multilayer ceramic capacitor according to the related art, and an available mounting space and manufacturing costs may be reduced due to a decrease in components.

In addition, in the multilayer ceramic capacitor, a main component in designing power integrity, ESR may be controlled to provide an effective design for power integrity.

Mounting Board for Multilayer Ceramic Capacitor

Figure 6:
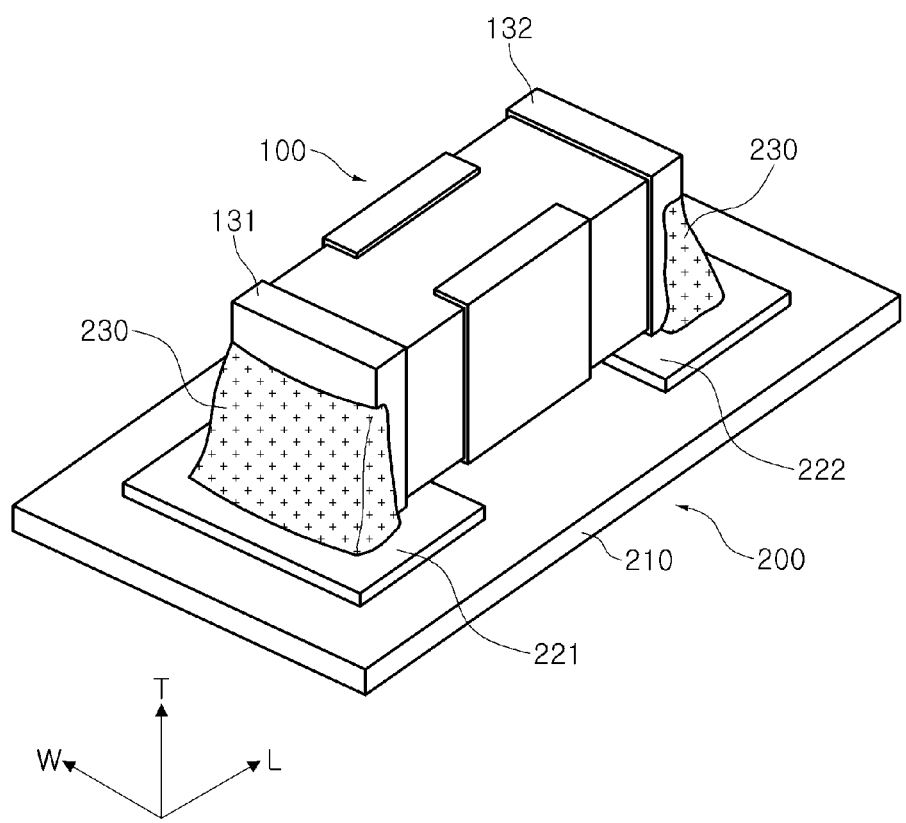
FIG. 6 is a perspective view showing a state in which the multilayer ceramic capacitor of FIG. 1 is mounted on a printed circuit board.

FIG. 6 is a perspective view showing a state in which the multilayer ceramic capacitor of FIG. 1 is mounted on a printed circuit board.

Figure 7:
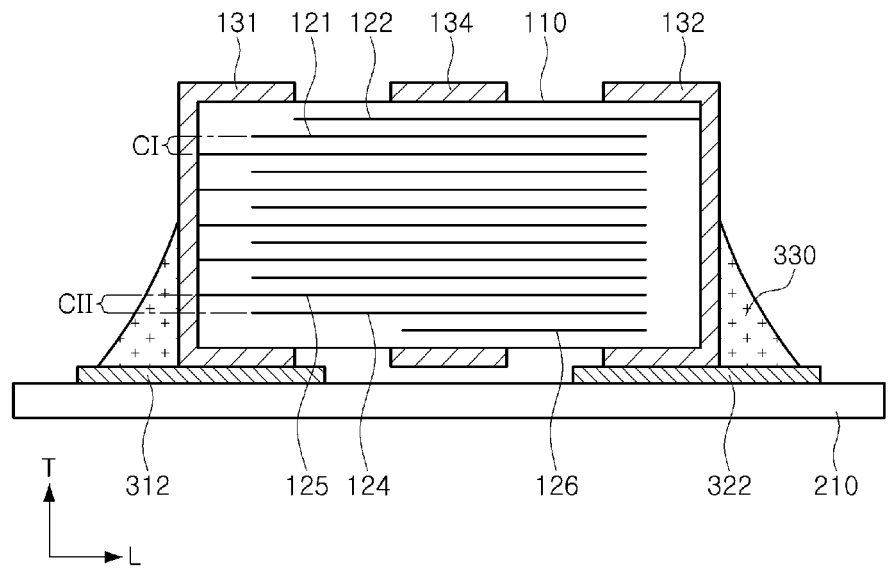
FIG. 7 is a cross-sectional view showing the multilayer ceramic capacitor and the printed circuit board of FIG. 6, cut in a length direction.

FIG. 7 is a cross-sectional view showing the multilayer ceramic capacitor and the printed circuit board of FIG. 6, cut in a length direction Referring to FIGS. 6 and 7, a mounting board 200 for the multilayer ceramic capacitor 100 according to the embodiment of the present invention may include: a printed circuit board 210 having the multilayer ceramic capacitor 100 mounted thereon so as to be in parallel therewith, and first and second electrode pads 221 and 222 formed on the printed circuit board 210 so as to be spaced apart from each other.

Here, the multilayer ceramic capacitor 100 may be electrically connected to the printed circuit board 210 by a soldering 230 while the first and second external electrodes 131 and 132 are disposed to contact the first and second electrode pads 221 and 222, respectively.

A description overlapped with that of the multilayer ceramic capacitor according to the foregoing embodiment of the present invention, except for the above description will be omitted.

Figure 8:
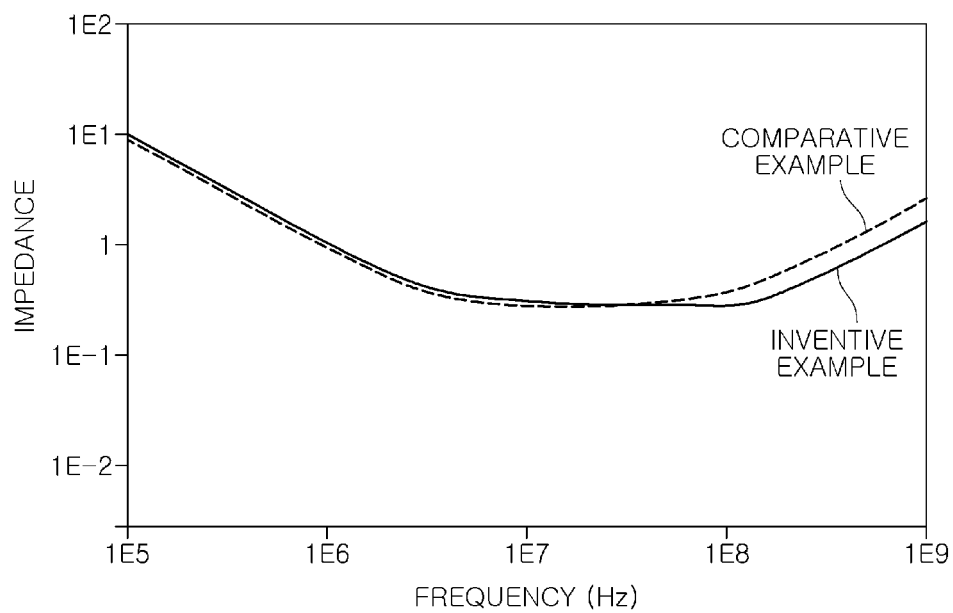
FIG. 8 is a graph comparing Inventive Example and Comparative Example of the present invention, in view of impedance.

FIG. 8 is a graph comparing Inventive Example and Comparative Example of the present invention, in view of impedance.

Referring to FIG. 8, in the multilayer ceramic capacitor of Inventive Example according to the embodiment of the present invention, impedance may be decreased in a relatively widened frequency band, as compared to the multilayer ceramic capacitor of Comparative Example according to the related art.

As set forth above, according to the embodiment of the present invention, two types of ESRs and capacitor parts, of which values are controlled, respectively, can be provided.

Therefore, a reduction in impedance and a control thereof may be facilitated within a relatively large frequency band, as compared to the case of a multilayer ceramic capacitor according to the related art, and an available mounting space and manufacturing costs may be reduced due to a decrease in components.

In addition, in the multilayer ceramic capacitor, a main component in designing power integrity, ESR may be controlled to provide an effective design for power integrity.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
   a ceramic body including a plurality of dielectric layers and having first and second main surfaces facing each other, first and second side surfaces facing each other, and first and second end surfaces facing each other;
   a first capacitor part formed in the ceramic body and including a first internal electrode exposed to the first end surface and a second internal electrode having a lead portion exposed to the first side surface, and a second capacitor part including a third internal electrode exposed to the first end surface and a fourth internal electrode having a lead portion exposed to the second side surface;
   first and second internal connection conductors disposed with respective dielectric layers interposed therebetween and having at least one polarity; and
   first to fourth external electrodes formed on outer surfaces of the ceramic body and electrically connected to the first to fourth internal electrodes and the first and second internal connection conductors,
   wherein the first capacitor part is connected to the first connection conductor in series, and the second capacitor part is connected to the second connection conductor in series, the second connection conductor being connected to the first connection conductor in series.

2. The multilayer ceramic capacitor of claim 1, wherein the first and second external electrodes are disposed on the first and second end surfaces facing each other of the ceramic body, and the third and fourth external electrodes are disposed on the first and second side surfaces facing each other of the ceramic body.

3. The multilayer ceramic capacitor of claim 1, wherein the first internal connection conductor is exposed to the first side surface and the second end surface and is connected to the second internal electrode through the third external electrode.

4. The multilayer ceramic capacitor of claim 1, wherein the second internal connection conductor is exposed to the first side surface and the second side surface and is connected to the fourth internal electrode through the fourth external electrode.

5. The multilayer ceramic capacitor of claim 1, wherein the second internal connection conductor is exposed to the first side surface and the second side surface and is connected to the second internal electrode through the third external electrode.

6. The multilayer ceramic capacitor of claim 4, wherein the second internal connection conductor is connected to the first internal connection conductor through the third external electrode.

7. The multilayer ceramic capacitor of claim 1, wherein the first capacitor part and the second capacitor part are connected in parallel.

8. The multilayer ceramic capacitor of claim 1, wherein equivalent series resistance (ESR) of the multilayer ceramic capacitor is controlled by the first internal connection conductor.

9. A mounting board for a multilayer ceramic capacitor, the mounting board comprising:
   a printed circuit board having first and second electrode pads disposed thereon; and
   a multilayer ceramic capacitor mounted on the printed circuit board,
   wherein the multilayer ceramic capacitor includes: a ceramic body including a plurality of dielectric layers and having first and second main surfaces facing each other, first and second side surfaces facing each other, and first and second end surfaces facing each other; a first capacitor part formed in the ceramic body and including a first internal electrode exposed to the first end surface and a second internal electrode having a lead portion exposed to the first side surface, and a second capacitor part including a third internal electrode exposed to the first end surface and a fourth internal electrode having a lead portion exposed to the second side surface; first and second internal connection conductors disposed with respective dielectric layers interposed therebetween and having at least one polarity; and first to fourth external electrodes formed on outer surfaces of the ceramic body and electrically connected to the first to fourth internal electrodes and the first and second internal connection conductors, and
   the first capacitor part is connected to the first connection conductor in series, and the second capacitor part is connected to the second connection conductor in series, the second connection conductor being connected to the first connection conductor in series.

10. The mounting board of claim 9, wherein the first and second external electrodes are disposed on the first and second end surfaces facing each other of the ceramic body, and the third and fourth external electrodes are disposed on the first and second side surfaces facing each other of the ceramic body.

11. The mounting board of claim 9, wherein the first internal connection conductor is exposed to the first side surface and the second end surface and is connected to the second internal electrode through the third external electrode.

12. The mounting board of claim 9, wherein the second internal connection conductor is exposed to the first side surface and the second side surface and is connected to the fourth internal electrode through the fourth external electrode.

13. The mounting board of claim 9, wherein the second internal connection conductor is exposed to the first side surface and the second side surface and is connected to the second internal electrode through the third external electrode.

14. The mounting board of claim 12, wherein the second internal connection conductor is connected to the first internal connection conductor through the third external electrode.

15. The mounting board of claim 9, wherein the first capacitor part and the second capacitor part are connected in parallel.

16. The mounting board of claim 9, wherein equivalent series resistance (ESR) of the multilayer ceramic capacitor is controlled by the first internal connection conductor.

17. The multilayer ceramic capacitor of 5, wherein the second internal connection conductor is connected to the first internal connection conductor through the third external electrode.

18. The mounting board of claim 13, wherein the second internal connection conductor is connected to the first internal connection conductor through the third external electrode.

\* \* \* \* \*